(12) United States Patent
Jung et al.

(10) Patent No.: US 9,806,233 B2
(45) Date of Patent: *Oct. 31, 2017

(54) LIGHT EMITTING DEVICE

(71) Applicant: LG INNOTEK CO., LTD., Seoul (KR)

(72) Inventors: Se Yeon Jung, Seoul (KR); Yong Gyeong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/232,263

(22) Filed: Aug. 9, 2016

(65) Prior Publication Data

US 2016/0351769 A1 Dec. 1, 2016

Related U.S. Application Data

(63) Continuation of application No. 14/927,112, filed on Oct. 29, 2015, now Pat. No. 9,437,781.

(30) Foreign Application Priority Data

Oct. 29, 2014 (KR) .......................... 10-2014-0147926

(51) Int. Cl.
*H01L 33/62* (2010.01)
*H01L 33/42* (2010.01)
(Continued)

(52) U.S. Cl.
CPC ............ *H01L 33/382* (2013.01); *H01L 33/06* (2013.01); *H01L 33/145* (2013.01); *H01L 33/42* (2013.01);
(Continued)

(58) Field of Classification Search
None
See application file for complete search history.

(56) References Cited

U.S. PATENT DOCUMENTS 9,437,781 B2 * 9/2016 Jung .................. H01L 33/46
2007/0114545 A1 5/2007 Jang et al.
(Continued)

FOREIGN PATENT DOCUMENTS

| EP | 2 466 653 A2 | 6/2012 |
|----|--------------|--------|
| EP | 2 482 345 A1 | 8/2012 |
| KR | 10-2013-0044717 A | 5/2013 |

*Primary Examiner* — Joseph Schoenholtz
(74) *Attorney, Agent, or Firm* — Birch, Stewart, Kolasch & Birch, LLP

(57) ABSTRACT

Disclosed is a light emitting device which includes a light emitting structure including a first conductive semiconductor layer, an active layer, and a second conductive semiconductor layer, a first current blocking layer, a second current blocking layer arranged on the light emitting structure to be separated from each other, a light-transmitting conductive layer arranged on the first current blocking layer, the second current blocking layer and the light emitting structure, first electrode and second electrode electrically coupled to the first conductive semiconductor layer and the second conductive semiconductor layer, respectively, a through hole formed through the light-transmitting conductive layer, the second conductive semiconductor layer and the active layer to a portion of the first conductive semiconductor layer, and a through electrode arranged inside the through hole. Here, the through electrode does not overlap the first current blocking layer in a vertical direction.

20 Claims, 18 Drawing Sheets

(51) Int. Cl.
- *H01L 33/38* (2010.01)
- *H01L 33/46* (2010.01)
- *H01L 33/14* (2010.01)
- *H01L 33/06* (2010.01)
- *H01L 33/20* (2010.01)

(52) U.S. Cl.
CPC .............. *H01L 33/46* (2013.01); *H01L 33/20* (2013.01); *H01L 33/62* (2013.01); *H01L 2224/48091* (2013.01); *H01L 2924/181* (2013.01)

(56) References Cited

U.S. PATENT DOCUMENTS

| | | |
|---|---|---|
| 2007/0145391 A1 | 6/2007 | Baik et al. |
| 2012/0113673 A1* | 5/2012 | Na .................... H01L 33/14 362/602 |
| 2013/0234192 A1* | 9/2013 | Kim .................... H01L 33/38 257/98 |
| 2014/0175465 A1 | 6/2014 | Lee et al. |

* cited by examiner

[Fig. 1]
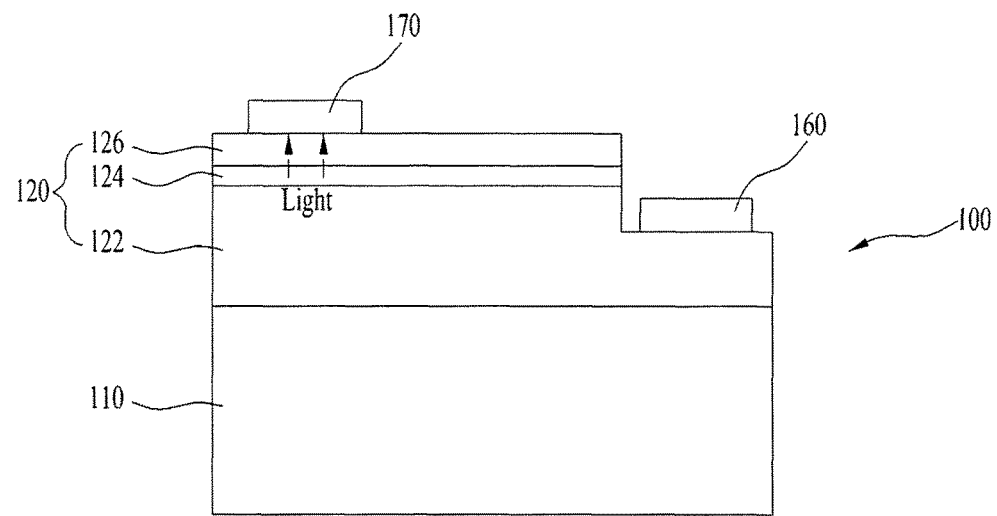
[Fig. 2a]
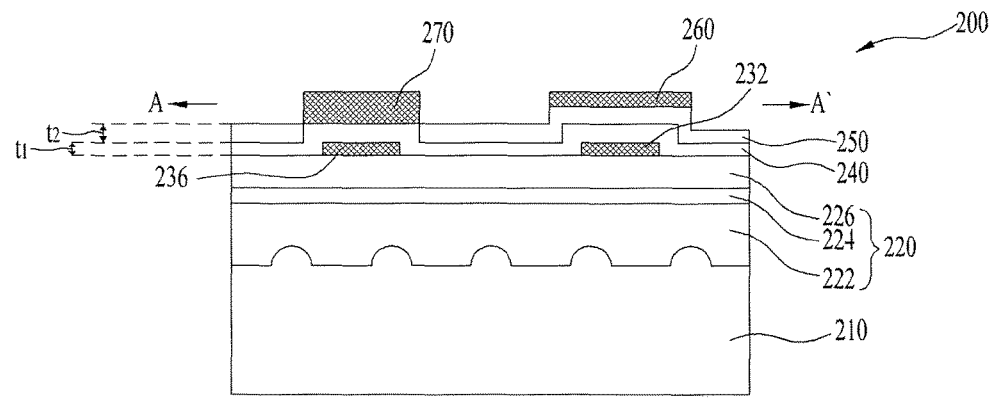

[Fig. 2b]
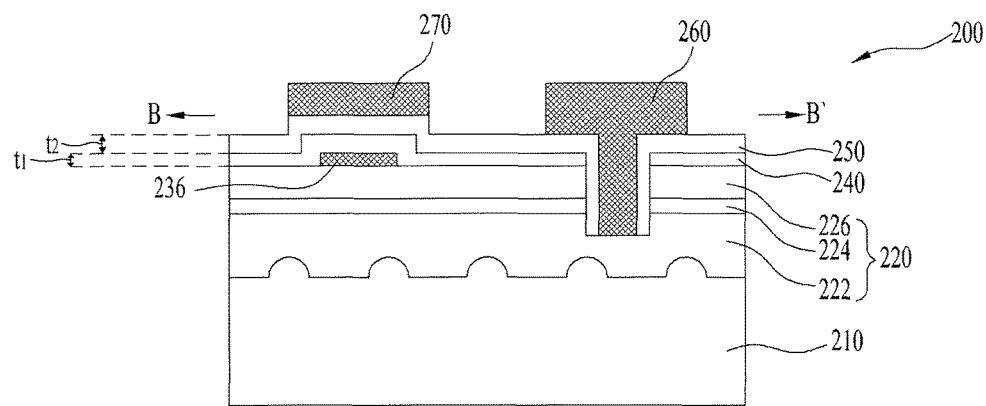
[Fig. 3a]
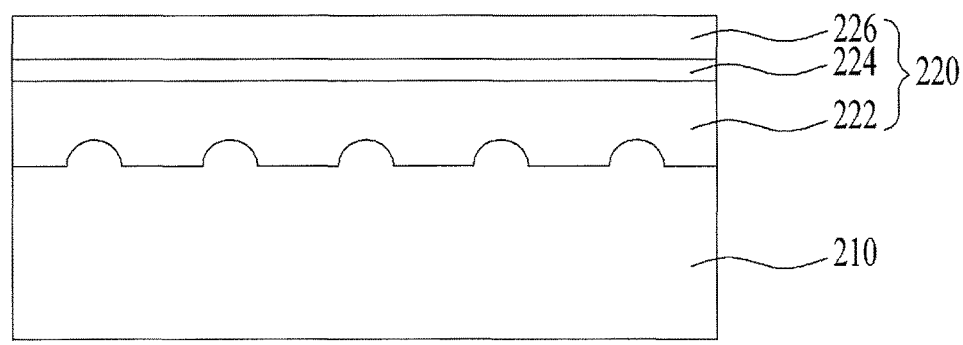

[Fig. 3b]
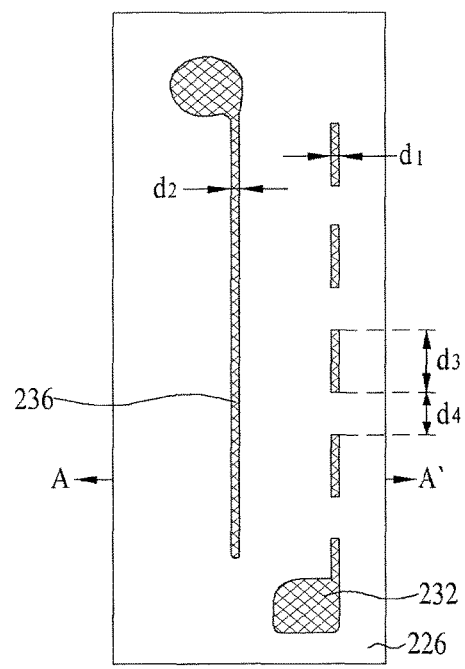
[Fig. 3c]
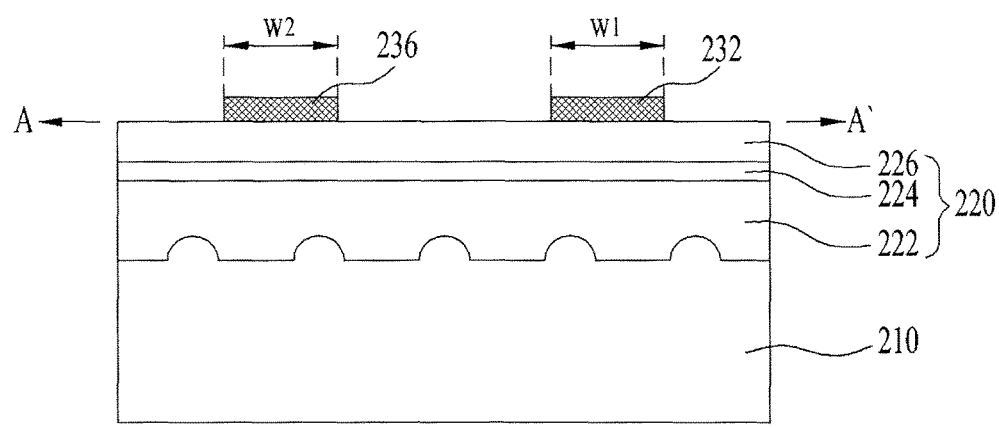

[Fig. 3d]
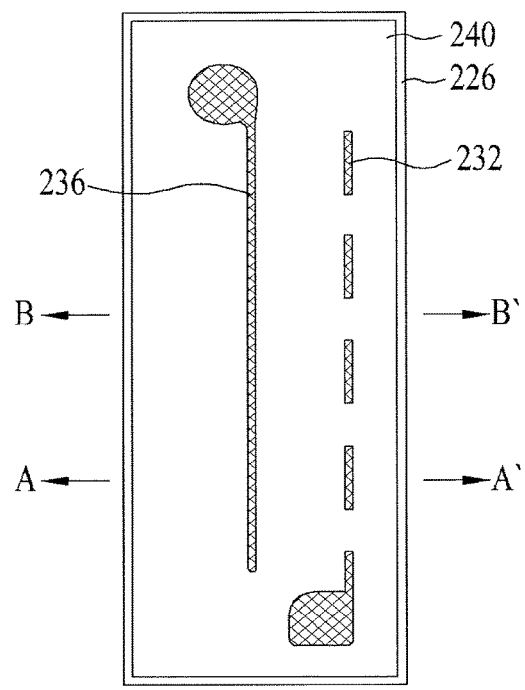
[Fig. 3e]
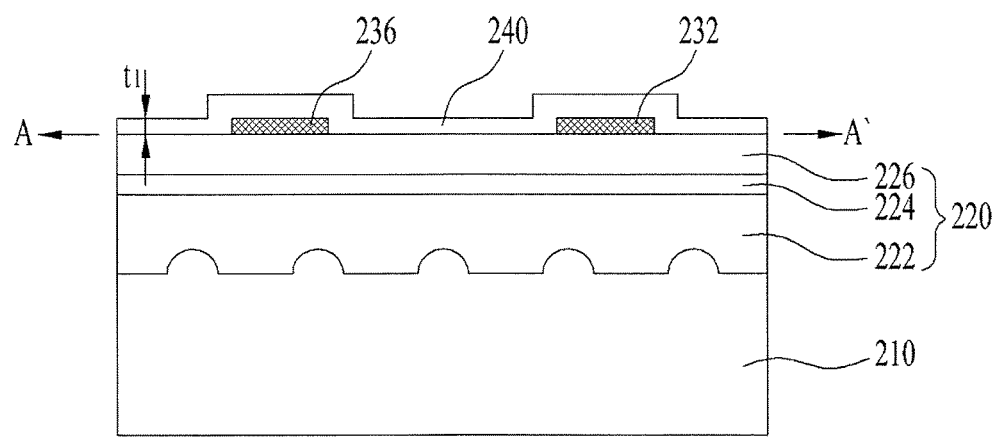

[Fig. 3f]
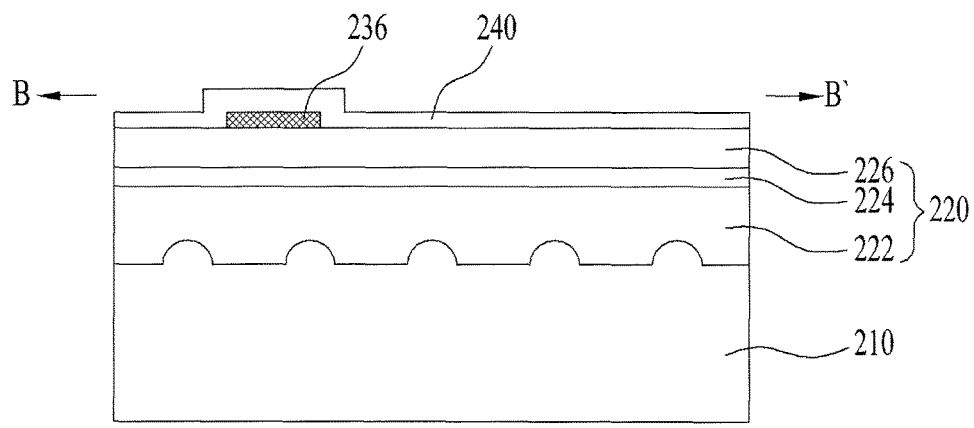
[Fig. 3g]
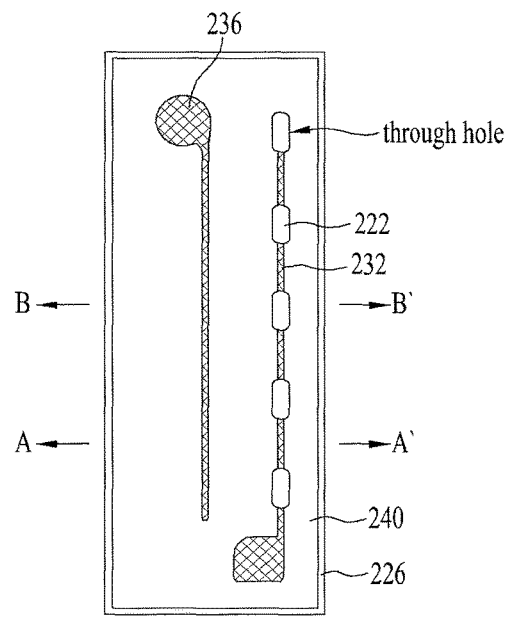

[Fig. 3h]
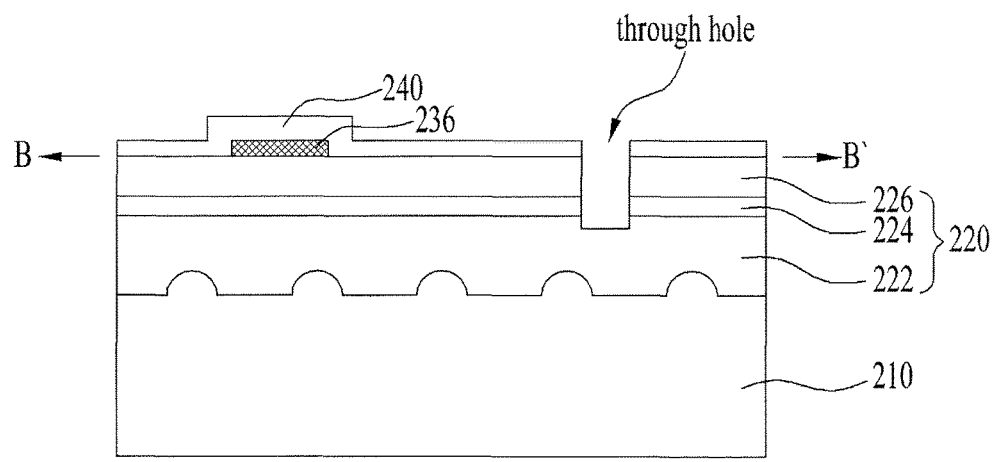
[Fig. 3i]
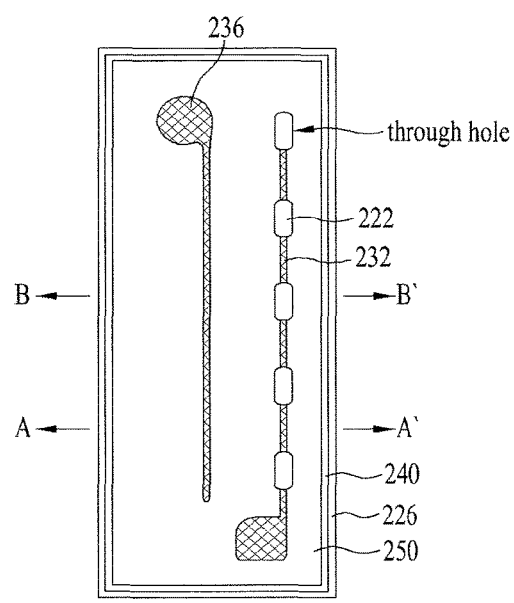

[Fig. 3j]
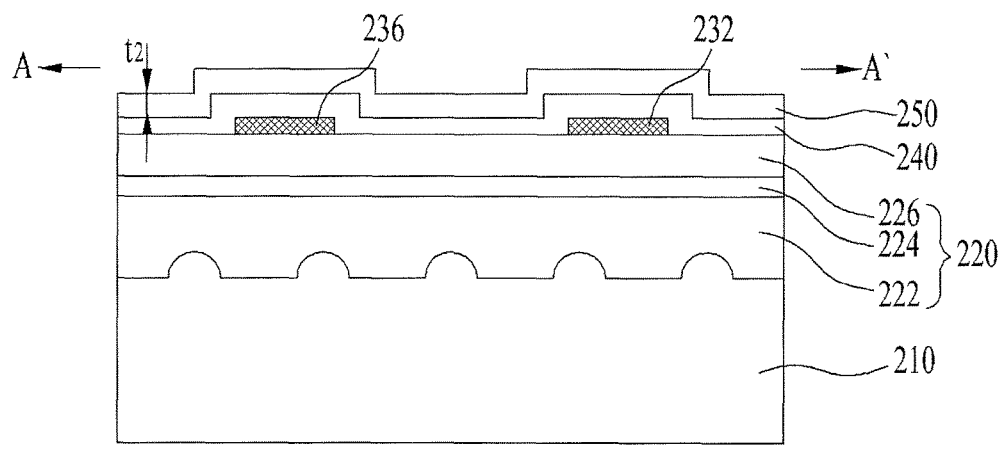
[Fig. 3k]
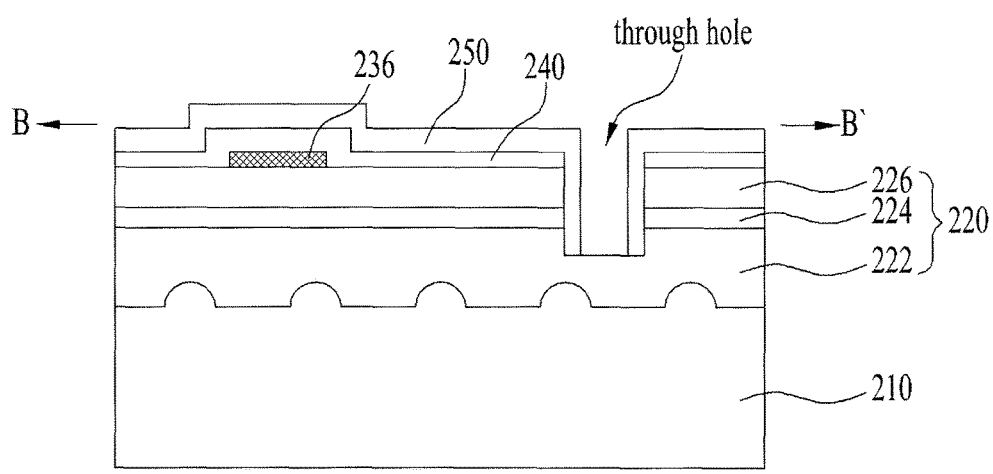

[Fig. 3l]
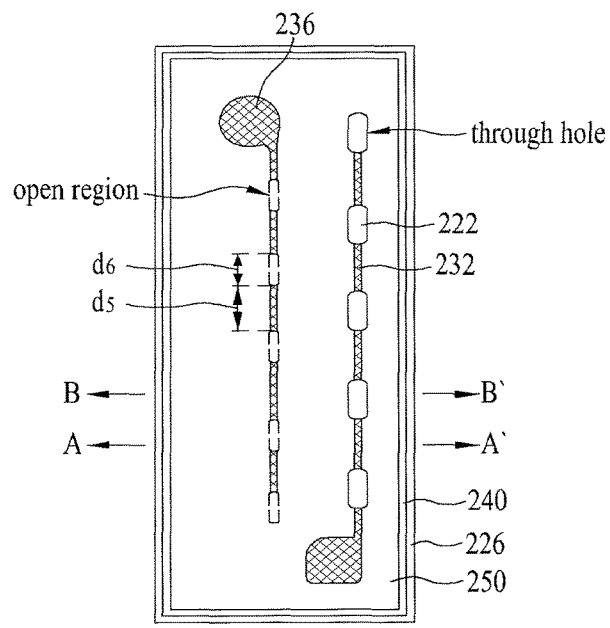
[Fig. 3m]
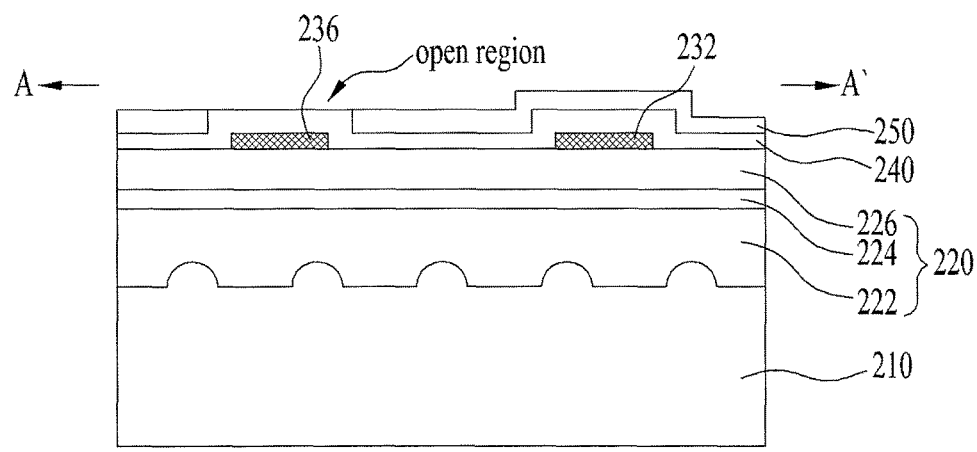

[Fig. 3n]
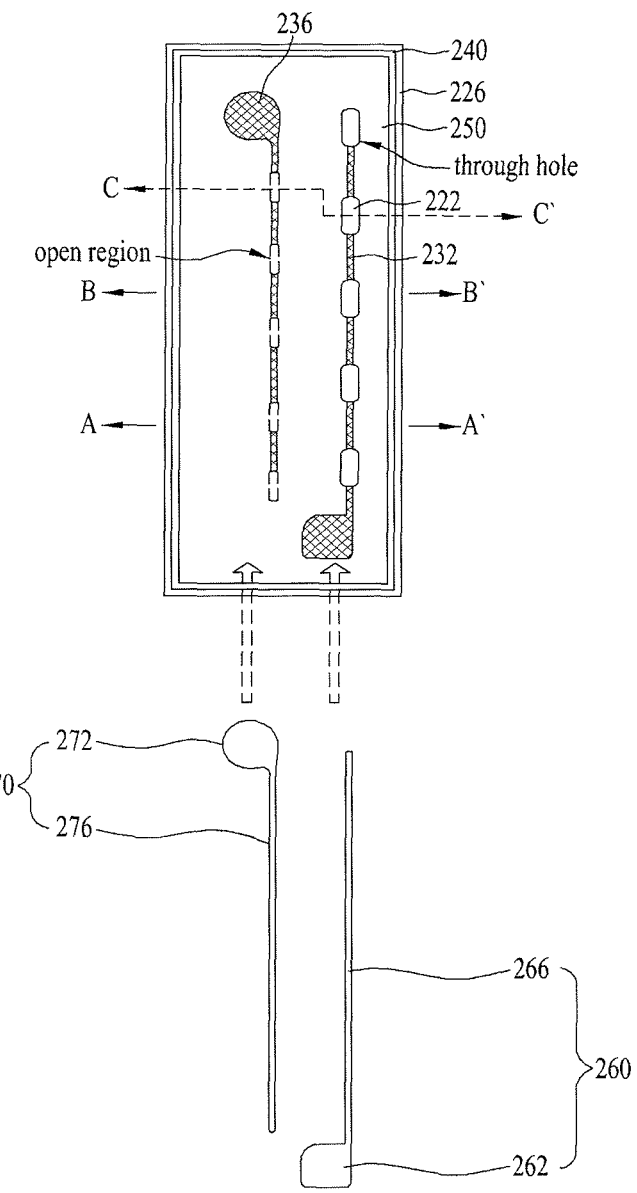

[Fig. 3o]
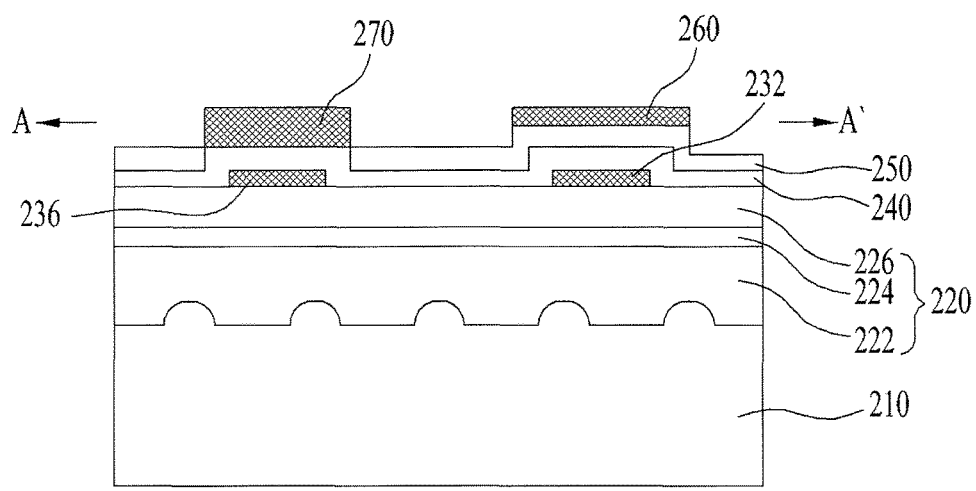
[Fig. 3p]
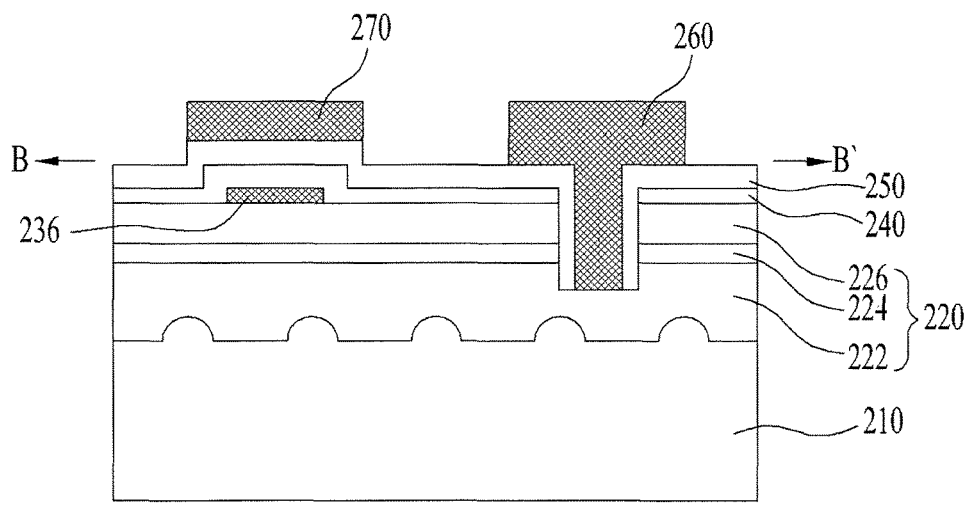

[Fig. 3q]
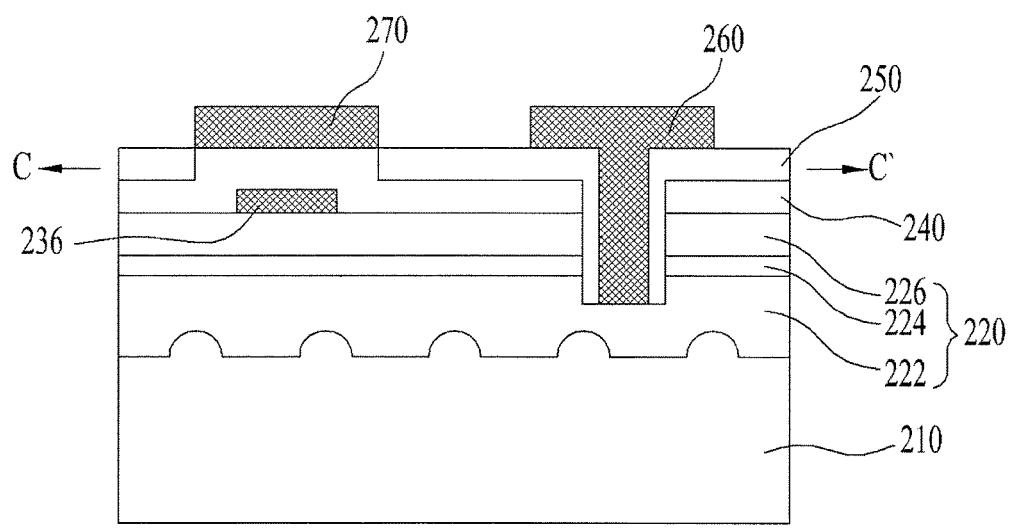
[Fig. 4a]
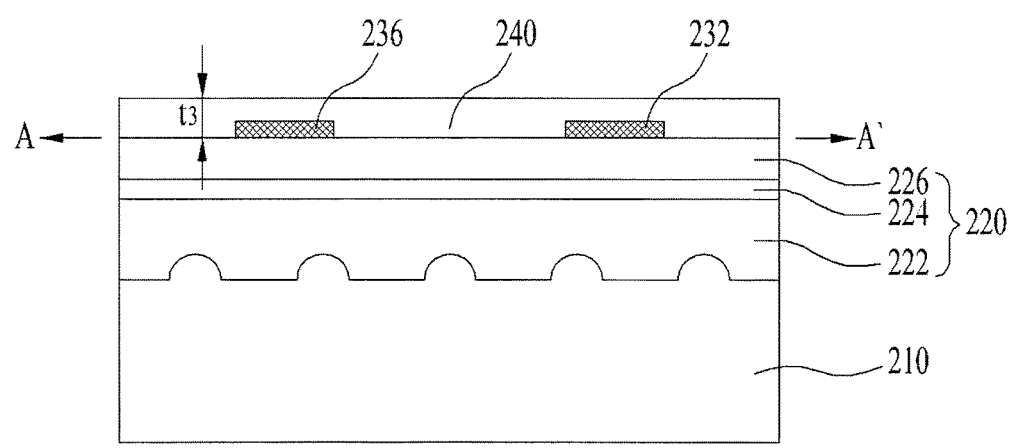

[Fig. 4b]
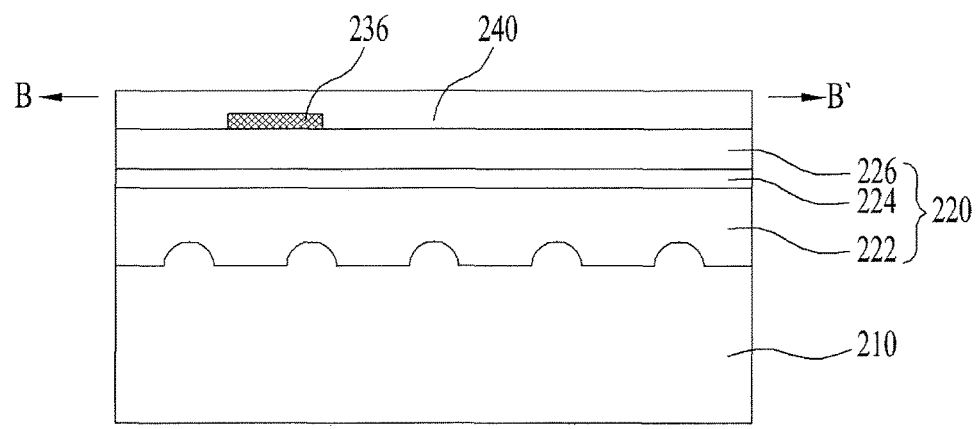
[Fig. 4c]
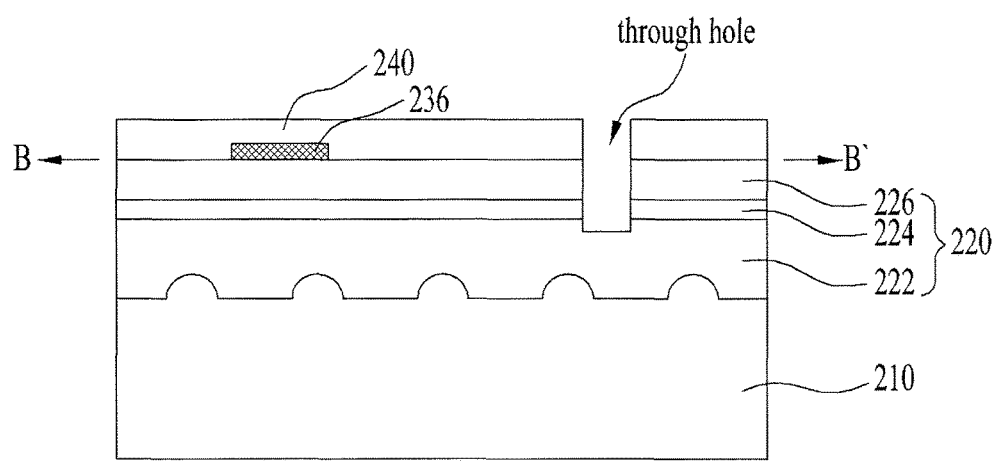

[Fig. 4d]
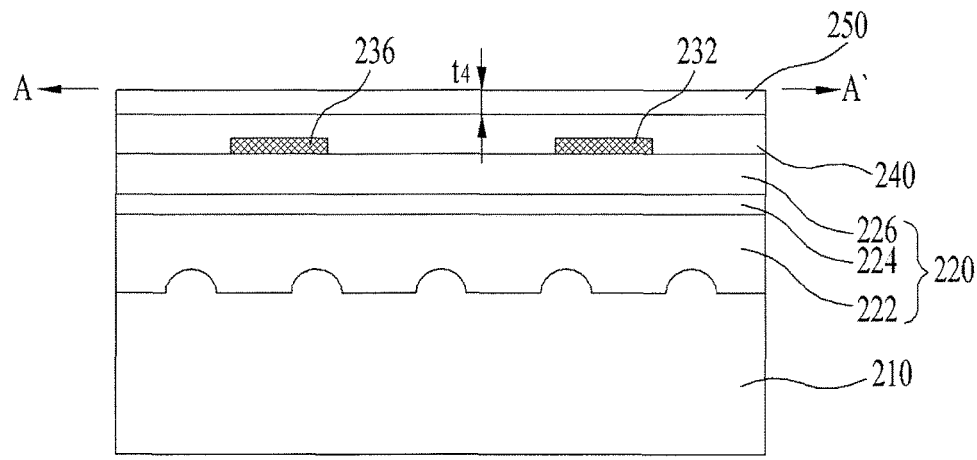
[Fig. 4e]
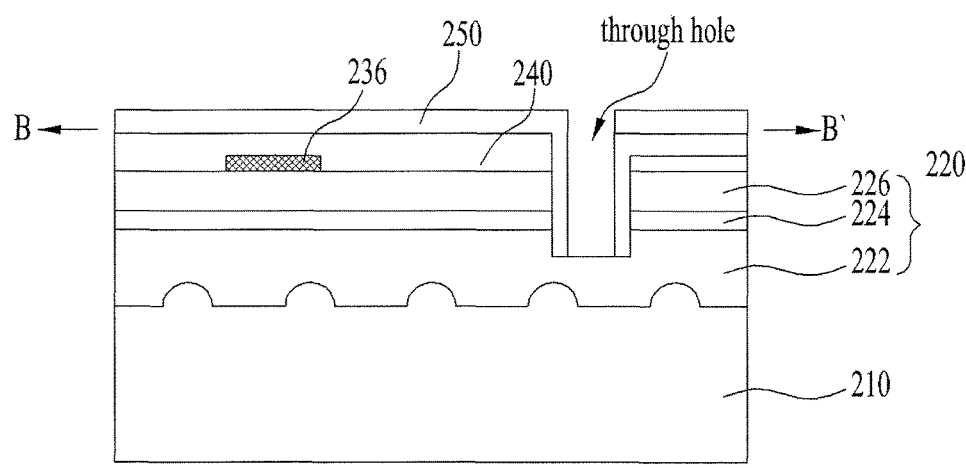

[Fig. 4f]
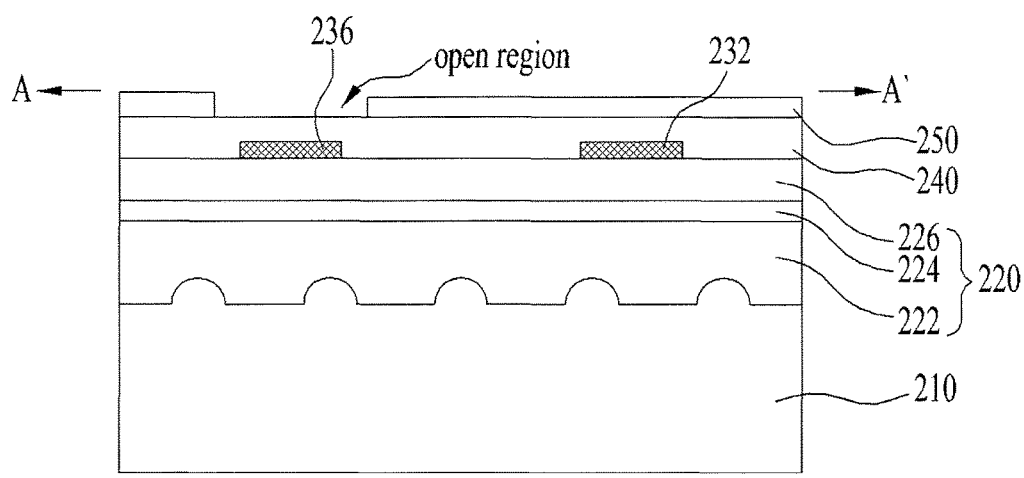
[Fig. 4g]
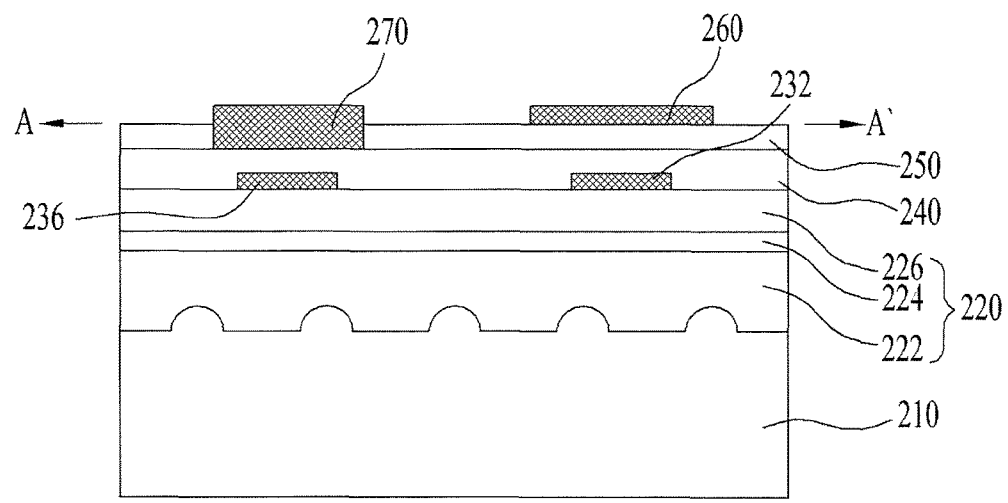

[Fig. 4h]
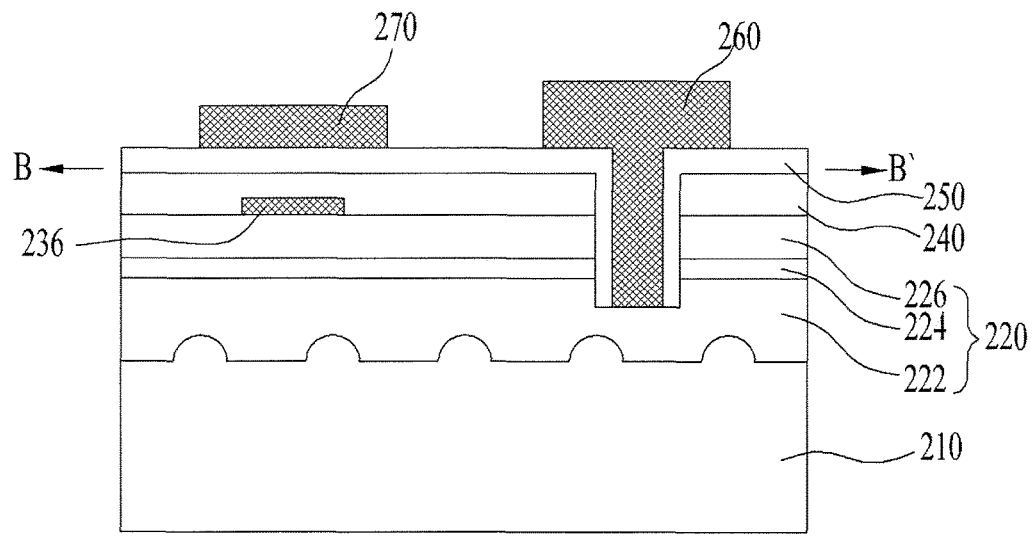
[Fig. 5a]
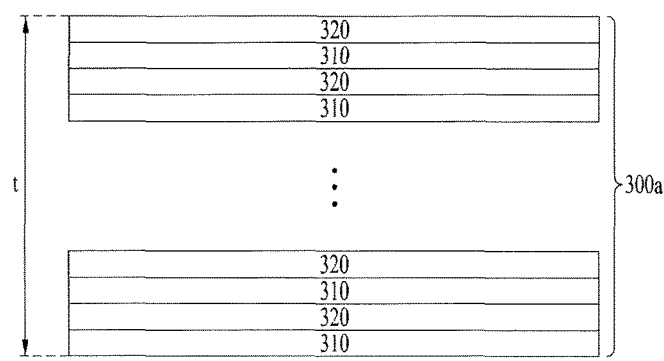

[Fig. 5b]
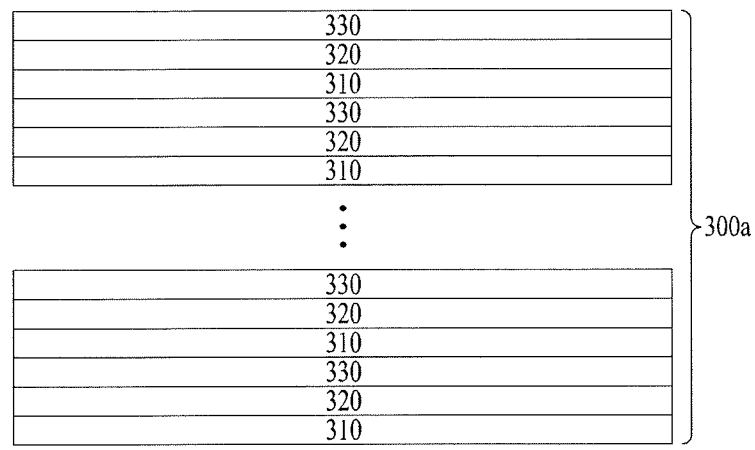
[Fig. 6a]
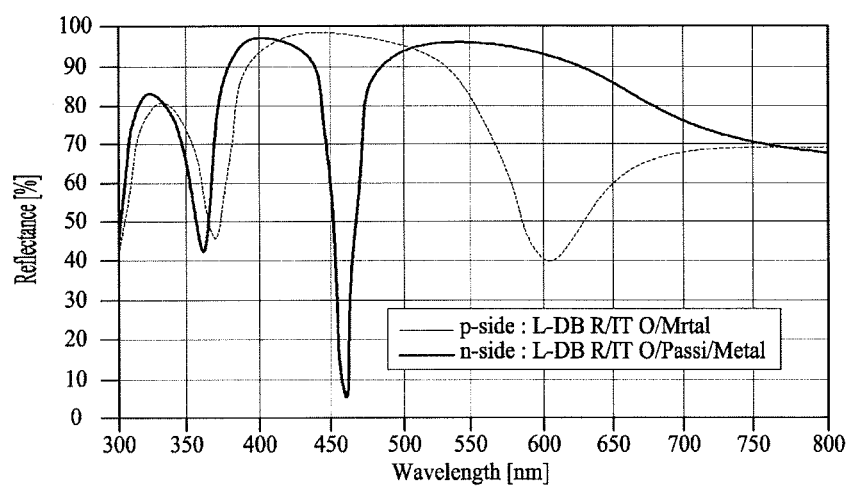

[Fig. 6b]
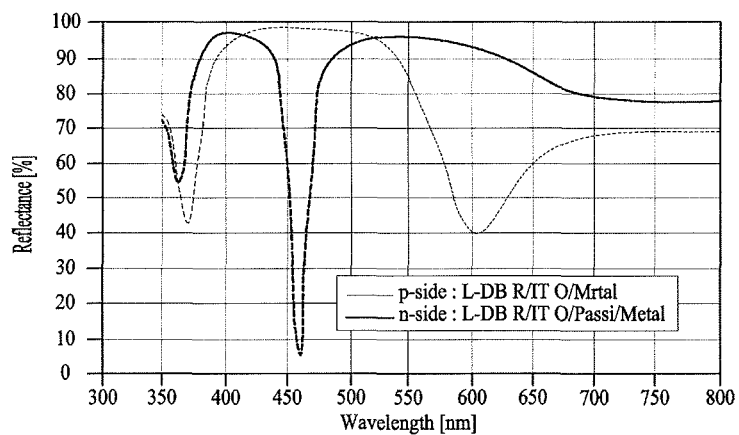
[Fig. 7a]
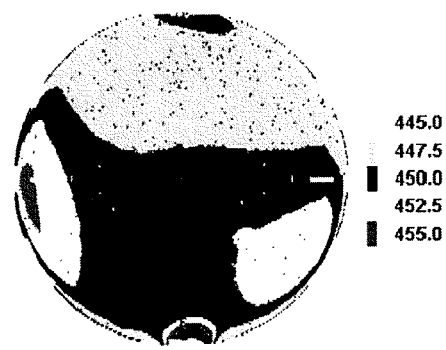
[Fig. 7b]
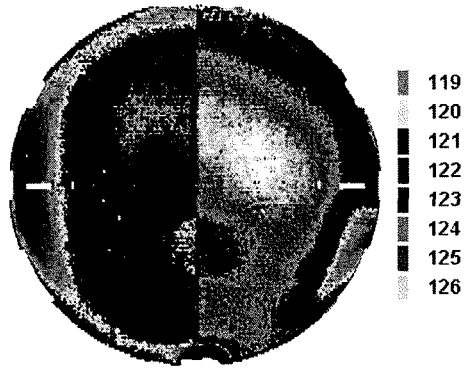

[Fig. 8]
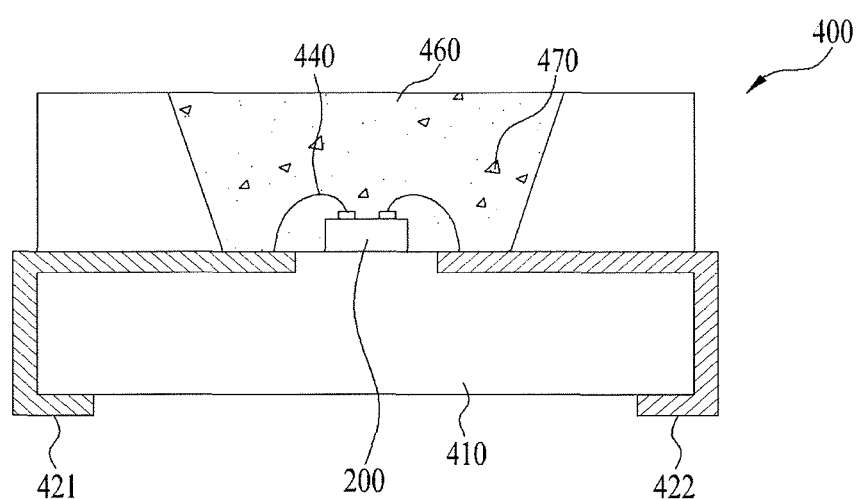

LIGHT EMITTING DEVICE

CROSS REFERENCE TO RELATED APPLICATION

This application is a Continuation of co-pending U.S. patent application Ser. No. 14/927,112, filed on Oct. 29, 2015, which claims priority under 35 U.S.C. §119 to Korean Patent Application No. 10-2014-0147926, filed in Korea on Oct. 29, 2014, which are hereby incorporated in its entirety by reference as if fully set forth herein.

TECHNICAL FIELD

Embodiments relate to a light emitting device.

BACKGROUND

Group III-V compound semiconductor materials such as GaN, AlGaN, and the like have various advantages such as wide, easily adjustable energy band gaps, and thus have been widely used for electronic devices in the field of optoelectronics.

Particularly, light emitting devices using Group III-V or II-VI compound semiconductor materials, such as light emitting diodes or laser diodes, have advantages in that they may be used to realize various colors such as red, green, blue, and ultraviolet (UV) colors with the development of thin film growth technology and device materials, and may also be used to realize highly effective white light beams by making use of fluorescent materials or combining colors, and have low power consumption, semi-permanent lifespan, rapid response time, safety, and environmental friendliness, compared to conventional light sources such as fluorescent lamps, incandescent lamps, etc.

Therefore, the light emitting devices have been increasingly applied to transmitter modules for optical communication systems, light emitting diode backlight units replacing cold cathode fluorescence lamps (CCFLs) constituting backlight units for liquid crystal display (LCD) devices, white light emitting diode lightings capable of replacing fluorescent lamps or incandescent lamps, car headlights, and traffic lights.

FIG. 1 is a diagram showing a conventional light emitting device.

A light emitting device 100 includes a substrate 110 formed of sapphire, and the like, a light emitting structure 120 arranged on the substrate 110 and including a first conductive semiconductor layer 122, an active layer 124, and a second conductive semiconductor layer 126, and a first electrode 160 and a second electrode 170 arranged on the first conductive semiconductor layer 122 and second conductive semiconductor layer 126, respectively.

As electrons injected through the first conductive semiconductor layer 122 and holes injected through the second conductive semiconductor layer 126 are combined at the active layer 124, the light emitting device 100 emits light with energy determined by an innate energy band of a material used to form the active layer 124. The light emitted from the active layer 124 may have varying colors, depending on compositions of the material forming the active layer 124. In this case, the light may include blue light, UV or deep UV rays, etc.

The light emitting device 100 may be arranged in a light emitting device package. In this case, light with a first wavelength region emitted from the light emitting device 100 may excite a phosphor, which then may emit light with a second wavelength region as the phosphor is excited by the light with the first wavelength region. Here, the phosphor may be included in a molding part surrounding the light emitting device 100, or may be arranged in the form of a phosphor film.

However, the above-described conventional light emitting device has the following drawbacks.

In the light emitted from the active layer 124, light traveling toward the second electrode 170 may be absorbed into the second electrode 170, resulting in degraded light efficiency of the light emitting device 100.

SUMMARY

Embodiments provide a light emitting device having improved light efficiency.

In one embodiment, a light emitting device includes a light emitting structure including a first conductive semiconductor layer, an active layer, and a second conductive semiconductor layer, a first current blocking layer and a second current blocking layer arranged on the light emitting structure to be separated from each other, a light-transmitting conductive layer arranged on the first current blocking layer, the second current blocking layer and the light emitting structure, a first electrode and a second electrode electrically coupled to the first conductive semiconductor layer and the second conductive semiconductor layer, respectively, a through hole formed through the light-transmitting conductive layer, the second conductive semiconductor layer and the active layer to a portion of the first conductive semiconductor layer, and a through electrode arranged inside the through hole, wherein the through electrode does not overlap the first current blocking layer in a vertical direction.

The light emitting device may further include an insulation layer arranged between the first electrode and the first current blocking layer and between the second electrode and the second current blocking layer.

The through hole may be formed through the insulation layer.

The through electrode and the first current blocking layer may be linearly arranged in a horizontal direction.

The insulation layer may be arranged in the through hole to extend around the through electrode.

The first electrode may include a first bonding pad and a first branched-finger electrode.

The first bonding pad may be arranged at a first edge region of the light emitting device.

At least a portion of the first branched-finger electrode may overlap the through electrode and the first current blocking layer in a vertical direction.

The through electrode may have a length smaller than a distance between neighboring through electrodes.

The second electrode may include a second bonding pad and a second branched-finger electrode.

The second bonding pad may be arranged at a second edge region of the light emitting device.

A portion of the second branched-finger electrode may overlap the second current blocking layer in a vertical direction.

A portion of the insulation layer may be opened to form an open region, and the light-transmitting conductive layer may be exposed through the open region.

The light-transmitting conductive layer and the second electrode may be brought into direct contact at the open region.

The open region and the through electrode may be alternately arranged in a horizontal direction.

At least one of the first current blocking layer and the second current blocking layer may be a distributed Bragg reflector (DBR) or an omni-directional reflector (ODR).

In another embodiment, a light emitting device includes a light emitting structure comprising a first conductive semiconductor layer, an active layer, and a second conductive semiconductor layer, a first current blocking layer and a second current blocking layer having a DBR or ODR structure and arranged on the light emitting structure to be separated from each other, a light-transmitting conductive layer arranged on the first current blocking layer, the second current blocking layer and the light emitting structure and having the smallest thickness at regions corresponding respectively to the first current blocking layer and the second current blocking layer, a first electrode and a second electrode electrically coupled to the first conductive semiconductor layer and the second conductive semiconductor layer, respectively, a through hole formed through the light-transmitting conductive layer, the second conductive semiconductor layer, and the active layer to a portion of the first conductive semiconductor layer, and a through electrode arranged in the through hole.

The first current blocking layer may have a plurality of portions arranged spaced apart from each other.

The through hole may be formed through the light-transmitting conductive layer, the second conductive semiconductor layer, and the active layer to a portion of the first conductive semiconductor layer, the light emitting device may further include a through electrode arranged in the through hole, and a spacing between the portions constituting the first current blocking layer may be the same as a length of the through hole.

In still another embodiment, a light emitting device includes a light emitting structure comprising a first conductive semiconductor layer, an active layer, and a second conductive semiconductor layer, a first current blocking layer and a second current blocking layer arranged on the light emitting structure to be separated from each other, a light-transmitting conductive layer arranged on the first current blocking layer, the second current blocking layer and the light emitting structure, a first electrode and a second electrode electrically coupled to the first conductive semiconductor layer and the second conductive semiconductor layer, respectively, and an insulation layer arranged between the first electrode and the first current blocking layer and between the second electrode and the second current blocking layer, wherein a through hole is formed through the insulation layer, the light-transmitting conductive layer, the second conductive semiconductor layer, and the active layer to a portion of the first conductive semiconductor layer, the through hole does not overlap the first current blocking layer in a vertical direction, a portion of the insulation layer is opened to form an open region, and the light-transmitting conductive layer is exposed through the open region, and the open region and the through electrode are alternately arranged in a horizontal direction.

BRIEF DESCRIPTION OF THE DRAWINGS

Arrangements and embodiments may be described in detail with reference to the following drawings in which like reference numerals refer to like elements and wherein:

FIG. 1 is a diagram showing a conventional light emitting device;

FIGS. 2A and 2B are cross-sectional views showing one embodiment of a light emitting device;

FIGS. 3A to 3Q are cross-sectional views showing one embodiment of a method of manufacturing a light emitting device;

FIGS. 4A to 4H are diagrams showing another embodiment of a method of manufacturing a light emitting device;

FIGS. 5A and 5B are diagrams showing one embodiment of a current blocking layer of the light emitting device;

FIGS. 6A and 6B show simulation and measurement results in which optical powers of light emitting devices according to embodiments are simulated and measured in certain wavelength regions;

FIGS. 7A and 7B are diagrams showing wavelength distributions and optical powers of light emitted from the light emitting device according to one embodiment and a conventional light emitting device, respectively; and FIG. 8 is a diagram showing one embodiment of a light emitting device package having the above-described light emitting device arranged therein.

DESCRIPTION OF SPECIFIC EMBODIMENTS

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

FIGS. 2A and 2B are cross-sectional views showing one embodiment of a light emitting device.

FIGS. 2A and 2B are cross-sectional views of one light emitting device 200, as viewed in different directions.

The light emitting device 200 as shown in FIG. 2A includes a substrate 210, a light emitting structure 220, a first current blocking layer 232, a second current blocking layer 236, a light-transmitting conductive layer 240, an insulation layer 250, a first electrode 260, and a second electrode 270.

The substrate 210 may be formed of a carrier wafer or a material suitable for growth of semiconductor materials, and may also be formed of a material showing excellent thermal conductivity. In this case, the substrate 210 may include a conductive substrate, or an insulating substrate. For example, the substrate 210 may be formed of at least one selected from the group consisting of sapphire ($Al_2O_3$), $SiO_2$, SiC, Si, GaAs, GaN, ZnO, GaP, InP, Ge, and $Ga_2O_3$.

When the substrate 210 is formed of sapphire, and the like, and the light emitting structure 220 including GaN or AlGaN is arranged on the substrate 210, a lattice mismatch between GaN or AlGaN and sapphire is very large, and a difference in thermal expansion coefficient between GaN or AlGaN and sapphire is significantly high, which leads to dislocation causing decrease in crystallinity, occurrence of melt-backs, cracks, and pits, interior surface morphology, and the like. Accordingly, a buffer layer (not shown) may be formed of AlN, etc.

Since a pattern is formed on a surface of the substrate 210 as shown in the drawings, light emitted from the light emitting structure 220 to travel toward the substrate 210 may be reflected on the pattern.

The light emitting structure 220 may include a first conductive semiconductor layer 222, an active layer 224, and a second conductive semiconductor layer 226.

The first conductive semiconductor layer 222 may be realized using Group III-V and Group II-VI compound semiconductor materials, etc., and may be doped with a first conductive dopant. The first conductive semiconductor layer 222 may be formed of at least one selected from the group consisting of semiconductor materials having a composition expression of $Al_xIn_yGa_{(1-x-y)}N$ (0≤x≤1, 0≤y≤1, and 0≤x+y≤1), for example, AlGaN, GaN, InAlGaN, AlGaAs, GaP, GaAs, GaAsP, and AlGaInP.

When the first conductive semiconductor layer 222 is an n-type semiconductor layer, the first conductive dopant may include an n-type dopant such as Si, Ge, Sn, Se, Te, etc. The first conductive semiconductor layer 222 may be formed in a single-layered or multilayered structure, but the disclosure is not limited thereto.

The active layer 224 may be arranged between the first conductive semiconductor layer 222 and the second conductive semiconductor layer 226, and may have one structure selected from the group consisting of a single well structure, a multiple well structure, a single quantum well structure, a multiple quantum well (MQW) structure, a quantum dot structure, and a quantum wire structure.

The active layer 224 may be formed in at least one pair structure of a well layer and a barrier layer, for example, AlGaN/AlGaN, InGaN/GaN, InGaN/InGaN, AlGaN/GaN, InAlGaN/GaN, GaAs(InGaAs)/AlGaAs, and GaP(InGaP)/AlGaP, using a Group III-V compound semiconductor material, but the disclosure is not limited thereto.

The well layer may be formed of a material having a lower energy band gap than the barrier layer.

The second conductive semiconductor layer 226 may be formed of a semiconductor compound. The second conductive semiconductor layer 226 may be realized using Group III-V and Group II-VI compound semiconductor materials, etc., and may be doped with a second conductive dopant. The second conductive semiconductor layer 226 may, for example, be formed of at least one selected from the group consisting of semiconductor materials having a composition expression of $In_xAl_yGa_{1-x-y}N$ (0≤x≤1, 0≤y≤1, and 0≤x+y≤1), for example, AlGaN, GaNAlInN, AlGaAs, GaP, GaAs, GaAsP, and AlGaInP. For example, the second conductive semiconductor layer 226 may be formed of $Al_xGa_{(1-x)}N$.

When the second conductive semiconductor layer 226 is a p-type semiconductor layer, the second conductive dopant may include a p-type dopant such as Mg, Zn, Ca, Sr, Ba, etc. The second conductive semiconductor layer 226 may be formed in a single-layered or multilayered structure, but the disclosure is not limited thereto.

Although not shown, an electron blocking layer may be arranged between the active layer 224 and the second conductive semiconductor layer 226. The electron blocking layer may be formed in a superlattice structure. In the superlattice structure, for example, AlGaN doped with the second conductive dopant may be arranged, and a plurality of layers formed of GaN and having different composition ratios of aluminum may also be alternately arranged.

The first current blocking layer 232 and the second current blocking layer 236 may be arranged on the second conductive semiconductor layer 226 to be spaced apart from each other. In this case, the first current blocking layer 232 and the second current blocking layer 236 may be selectively arranged on a portion of the second conductive semiconductor layer 226, and may be made of an insulating material.

The light-transmitting conductive layer 240 may be arranged on the second conductive semiconductor layer 226, the first current blocking layer 232, and the second current blocking layer 236. In this case, the light-transmitting conductive layer 240 may be made of indium tin oxide (ITO), etc. However, since the second conductive semiconductor layer 226 has poor current spreading characteristics, the light-transmitting conductive layer 240 may receive a current from the second electrode 270.

The light-transmitting conductive layer 240 may have a constant thickness $t_1$, and thus a height of the light-transmitting conductive layer 240 may be greater at regions corresponding to the first current blocking layer 232 and the second current blocking layer 236 than the other regions thereof.

The insulation layer 250 may be arranged on the light-transmitting conductive layer 240. In this case, a portion of the insulation layer 250 may be opened so that the light-transmitting conductive layer 240 is exposed through an upper region of the second current blocking layer 236. The insulation layer 250 may be made of an oxide or a nitride. Specifically, the insulation layer 250 may be formed as a silicon oxide ($SiO_2$) layer, an oxynitride layer, or an aluminum oxide layer.

In addition, since the insulation layer 250 may be formed in a constant thickness $t_2$ at a region other than the above-described open region, the height of the insulation layer 250 may be greater at a region corresponding to the first current blocking layer 232 than the other regions thereof.

The first electrode 260 and the second electrode 270 may be arranged on the insulation layer 250 to be spaced apart from each other. In this case, the first electrode 260 and the second electrode 270 may be arranged on regions corresponding to the first current blocking layer 232 and the second current blocking layer 236, respectively.

The insulation layer 250 may be arranged between the first electrode 260 and the light-transmitting conductive layer 240, or the second electrode 270 and the light-transmitting conductive layer 240 may be brought into direct contact at the above-described open region of the insulation layer 250.

FIG. 2A is a cross-sectional view taken along line A-A' of the light emitting device 200, and FIG. 2B is a cross-sectional view taken along line B-B' of the light emitting device 200.

The substrate 210 and the light emitting structure 220 have the same structure as the light emitting device 200 as shown in FIG. 2A, but are different from the light emitting device 200 in that the first current blocking layer 232 is not arranged in a direction taken along line B-B'.

The second current blocking layer 236 may be arranged on the second conductive semiconductor layer 226, and the light-transmitting conductive layer 240 may be arranged on the second conductive semiconductor layer 226 and the second current blocking layer 236.

The light-transmitting conductive layer 240 may have a constant thickness $t_1$, and thus a height of the light-transmitting conductive layer 240 may be greater at a region corresponding to the second current blocking layer 236 than the other regions thereof.

The insulation layer 250 may be arranged on the light-transmitting conductive layer 240. In this case, the insulation layer 250 may have a constant thickness $t_2$, and thus a height of the insulation layer 250 may be greater at a region corresponding to the second current blocking layer 236 in a vertical direction than the other regions thereof.

Additionally, the second electrode 270 may be arranged on the insulation layer 250. In this case, the second electrode 270 may be arranged to correspond to the second current blocking layer 236 in a vertical direction. In addition, the light-transmitting conductive layer 240 and the second electrode 270 may not be brought into direct contact, unlike that in FIG. 2A.

In addition, a through hole is formed downward from the first electrode 260, as shown in FIG. 2B. The through hole may be formed through the light-transmitting conductive layer 240, the second conductive semiconductor layer 226, and the active layer 224 so that the through hole spans from the insulation layer 250 to a portion of the first conductive semiconductor layer 222.

Further, the insulation layer 250 may be arranged on inner sidewalls of the through hole to extend to the inner sidewalls. The first electrode 260 is formed on the through hole. In this case, since the first electrode 260 is arranged in the through hole to extend to an inner part of the through hole, the first conductive semiconductor layer 222 and the first electrode 260 may be brought into direct electrical contact at a bottom surface of the through hole. Here, a portion of the first electrode 260 arranged inside the through hole may be referred to as a through electrode.

FIGS. 3A to 3P are diagrams showing one embodiment of a method of manufacturing a light emitting device.

As shown in FIG. 3A, the first light emitting structure 220 is allowed to grow on the substrate 210.

The substrate 210 may be formed of sapphire as described above, and, although not shown, the above-described buffer layer (not shown) may be allowed to grow prior to growth of the light emitting structure 220.

The first conductive semiconductor layer 222 may be allowed to grow using a method such as chemical vapor deposition (CVD), molecular beam epitaxy (MBE), sputtering, or hydride vapour phase epitaxy (HVPE). The first conductive semiconductor layer 222 has the same composition as described above, and bis(ethyl cyclopentadienyl) magnesium ((EtCp$_2$Mg){Mg(C$_2$H$_5$C$_5$H$_4$)$_2$}) including p-type impurities such as trimethyl gallium gas (TMGa), ammonia gas (NH$_3$), nitrogen gas (N$_2$), and magnesium (Mg) may be injected into a chamber at a temperature of approximately 1,000° C. to form a p-type GaN layer, but the disclosure is not limited thereto.

In addition, the active layer 224 is allowed to grown on the first conductive semiconductor layer 222. For the active layer 224, for example, trimethyl gallium gas (TMGa), ammonia gas (NH$_3$), nitrogen gas (N$_2$), and trimethyl indium gas (TMIn) may be injected at a temperature of approximately 700° C. to 800° C. to form a MQW structure, but the disclosure is not limited thereto.

Additionally, the second conductive semiconductor layer 226 is allowed to grown on the active layer 224. In this case, the second conductive semiconductor layer 226 may have the same composition as described above.

The second conductive semiconductor layer 226 is allowed to grown by supplying Zn and O$_2$ at a temperature of approximately 500° C., and may be doped with an n-type dopant. For example, the second conductive semiconductor layer 226 may be doped with Si, Ge, Sn, Se, Te, etc. The second conductive semiconductor layer 226 may be formed using a method such as metal organic (MO)-CVD, plasma-enhanced (PE)-CVD, or sputtering, and Al, Fe and Ga may be added thereto.

In addition, as shown in FIGS. 3B and 3C, the first current blocking layer 232 and the second current blocking layer 236 are allowed to grown on the second conductive semiconductor layer 226.

The first current blocking layer 232 and the second current blocking layer 236 may be made of an insulating material. Specifically, the first current blocking layer 232 and the second current blocking layer 236 may be a distributed Bragg reflector (DBR) or an omni-directional reflector (ODR), and thus specific configurations thereof will be described below.

The first current blocking layer 232 and the second current blocking layer 236 may be selectively formed using a mask, or may be formed by forming one current blocking layer on an entire surface of the second conductive semiconductor layer 226 and selectively removing the current blocking layer.

A section of the first current blocking layer 232 and the second current blocking layer 236 is shown in FIG. 3B. Here, a width d$_1$ of the first current blocking layer 232 and a width d$_2$ of the second current blocking layer 236 may be the same as or different from each other. In addition, the first current blocking layer 232 may be formed to have a pattern. In this case, a length d$_3$ of one portion of the first current blocking layer 232 formed to have the pattern may be larger than a spacing d$_4$ between respective portions of the first current blocking layer 232, but the disclosure is not particularly limited thereto. Here, the spacing d$_4$ between the respective portions of the first current blocking layer 232 may be a length of the through hole or the through electrode.

A section taken along line A-A' in FIG. 3B is shown in FIG. 3C. Here, a width w$_1$ of the first current blocking layer 232 and a width w$_2$ of the second current blocking layer 236 may be the same as or different from each other.

In addition, as shown in FIGS. 3D to 3F, the light-transmitting conductive layer 240 may be formed on the second conductive semiconductor layer 226 on which the first current blocking layer 232 and the second current blocking layer 236 are formed.

A section taken along line A-A' in FIG. 3D is shown in FIG. 3E, and a section taken along line B-B' in FIG. 3D is shown in FIG. 3F.

As shown in FIG. 3E, since the light-transmitting conductive layer 240 may be arranged on the first current blocking layer 232 and the second current blocking layer 236 so that the light-transmitting conductive layer 240 has a constant thickness t$_1$, a height of the light-transmitting conductive layer 240 may be greater at regions corresponding to the first current blocking layer 232 and the second current blocking layer 236 than the other regions thereof.

The second current blocking layer 236 may be integrally arranged, and the first current blocking layer 232 may have a plurality of portions spaced at constant intervals, as shown in FIGS. 3B and 3D. In addition, as shown in FIG. 3F, the second current blocking layer 236 may be formed on the second conductive semiconductor layer 226, but the first current blocking layer 232 may not be formed on the second conductive semiconductor layer 226, as viewed from a section taken along line B-B' in FIG. 3D.

Additionally, as shown in FIGS. 3G and 3H, a through hole may be formed through the second conductive semiconductor layer 226 and the active layer 224 so that the through hole spans from the light-transmitting conductive layer 240 to a portion of the first conductive semiconductor layer 222.

As shown in FIG. 3G, through holes may be formed at regions between the first current blocking layers 232. A section taken along line B-B' in FIG. 3G is shown in FIG. 3H. In this case, a section taken along line A-A' in FIG. 3G may be the same in FIG. 3E since the through holes are not formed.

In addition, as shown in FIGS. 3I to 3K, the insulation layer 250 may be formed on the light-transmitting conductive layer 240.

As shown in FIG. 3I, the insulation layer 250 may be formed on the light-transmitting conductive layer 240 so that the insulation layer 250 has a constant thickness. A section taken along line A-A' in FIG. 3I is shown in FIG. 3J. Here, since the insulation layer 250 is formed on the light-transmitting conductive layer 240 so that the insulation layer 250 has a constant thickness $t_2$, a height of the insulation layer 250 may be greater at regions corresponding to the first current blocking layer 232 and the second current blocking layer 236 than the other regions thereof.

A section taken along line B-B' in FIG. 3I is shown in FIG. 3K. Here, the insulation layer 250 may be arranged on inner sides of the through hole to extend to the inner sides of the through hole. In this case, the first conductive semiconductor layer 222 may be exposed through a bottom surface of the through hole.

As shown in FIGS. 3J and 3K, the through hole does not overlap the first current blocking layer 232 in a vertical direction. In this case, it could be seen that, since the through hole and the first current blocking layer 232 are linearly arranged in a horizontal direction, shapes of the through hole and the first current blocking layer 232 are similar to that of the first electrode 260 shown in FIG. 3N, as viewed in a horizontal direction.

In addition, as shown in FIGS. 3L and 3M, an open region is formed on the second current blocking layer 236 in the insulation layer 250. Here, the above-described open region may be alternately arranged with the through holes or through electrodes in a horizontal direction without facing the through holes or through electrodes, as shown in FIG. 3L.

As shown in FIG. 3L and FIG. 3N as will be described later, the second current blocking layer 236 is not shown to correspond to the open region for the sake of convenience of description, but the light-transmitting conductive layer 240 and the second current blocking layer 236 may be actually arranged below the open region.

As shown in FIG. 3L, a length $d_6$ of one of the open regions, and a length $d_5$ between the respective open regions through which the second current blocking layer 236 is exposed may be the same as or different from each other.

FIG. 3M is a cross-sectional view taken along line A-A' in FIG. 3L. Here, the light-transmitting conductive layer 240 may be exposed since the insulation layer 250 is removed from a region corresponding to the second current blocking layer 236 in a vertical direction using a method such as etching. In this case, a section taken along line B-B' in FIG. 3L may be the same in FIG. 3K.

In addition, as shown in FIG. 3N, the first electrode 260 and the second electrode 270 are arranged using a method such as vapor deposition. The first electrode 260 and the second electrode 270 may be formed in a single-layered or multilayered structure to include at least one selected from the group consisting of aluminum (Al), titanium (Ti), chromium (Cr), nickel (Ni), copper (Cu), and gold (Au).

The first electrode 260 may include a first bonding pad 262 and a first branched-finger electrode 266, and the second electrode 270 may include a second bonding pad 272 and a second branched-finger electrode 276.

The first bonding pad 262 and the second bonding pad 272 may be arranged on first and second edge regions of the light emitting device, respectively, and bonded to the first and second edge regions by means of wires. In this case, the first and second edge regions may be regions on facing corners, as shown in FIG. 3N.

In addition, as shown in FIG. 3N, the first branched-finger electrode 266 may be arranged on a region which overlap the through hole (through electrode) and the first current blocking layer 232 in a vertical direction.

The first electrode 260 and the second electrode 270 may be formed of the above-listed materials using a method such as vapor deposition. In this case, the first electrode 260 and the second electrode 270 may be deposited to correspond to the first current blocking layer 232 and the second current blocking layer 236, respectively.

As shown in FIG. 3N, a portion of the second branched-finger electrode 276 may be arranged to overlap the second current blocking layer 236 in a vertical direction.

Cross-sectional views taken along lines A-A', B-B', and C-C' of the finished light emitting device are shown in FIGS. 3O, 3P, and 3Q, respectively. Here, the light emitting device shown in FIGS. 3O and 3P is the same as the light emitting device 200 shown in FIGS. 2A and 2B.

In the light emitting device 200 according to one embodiment, the second current blocking layer 236, the light-transmitting conductive layer 240, and the insulation layer 250 may be arranged between the second conductive semiconductor layer 226 and the second electrode 270, and the second current blocking layer 236 and the light-transmitting conductive layer 240 may be arranged between the second conductive semiconductor layer 226 and the second electrode 270 when the light-transmitting conductive layer 240 is in an open region.

In addition, the first electrode 260 may be brought into direct electrical contact with the first conductive semiconductor layer 222 through the through hole formed at a region corresponding to the first conductive semiconductor layer 222. Additionally, the first current blocking layer 232, the light-transmitting conductive layer 240, the insulation layer 250, and the first electrode 260 may be arranged on the first current blocking layer 232 in a region in which the through hole is not formed.

A cross-sectional view taken along line C-C' of the light emitting device is shown in FIG. 3Q. A section of a neighboring region of the first electrode 260 shown in FIG. 3Q is similar to a section shown in FIG. 3P, and a section of a neighboring region of the second electrode 270 is similar to a section shown in FIG. 3O.

FIGS. 4A to 4H are diagrams showing another embodiment of a method of manufacturing a light emitting device. Hereinafter, configurations of the method of manufacturing a light emitting device according to one embodiment, which are different from the above-described embodiments, will be mainly described for clarity.

The light-transmitting conductive layer 240 may be formed on the second conductive semiconductor layer 226 on which the first current blocking layer 232 and the second current blocking layer 236 are formed. A section taken along line A-A' is shown in FIG. 4A, and a section taken along line B-B' is shown in FIG. 4B.

As shown in FIG. 4A, since the transmitting conductive layer 240 is arranged on the first current blocking layer 232 and the second current blocking layer 236 so that the light-transmitting conductive layer 240 has a thickness $t_3$. Here, the thickness $t_3$ may be the same as or different from the thickness $t_1$ shown in FIG. 3E. Unlike the above-described embodiments, the transmitting conductive layer 240 may not have a constant thickness since a top surface of the light-transmitting conductive layer 240 is formed to be flush with each other. Therefore, the above-described thickness $t_3$ may be a thickness of a region of the light-transmitting conductive layer 240 on which the first current blocking layer 232 and the second current blocking layer 236 are not arranged.

In addition, the light-transmitting conductive layer 240 may have the smallest thickness at regions corresponding to the first current blocking layer 232 and the second current blocking layer 236 in a vertical direction.

Additionally, as shown in FIG. 4C, a through hole may be formed through the second conductive semiconductor layer 226 and the active layer 224 so that the through hole spans from the light-transmitting conductive layer 240 to a portion of the first conductive semiconductor layer 222.

A cross-sectional view taken along line B-B' of the light emitting device is shown in FIG. 4C. Here, the through hole may not be formed in a cross-sectional view taken along line A-A' of the light emitting device.

In addition, as shown in FIGS. 4D and 4E, the insulation layer 250 may be formed on the light-transmitting conductive layer 240.

A section taken along line A-A' of the light emitting device is shown in FIG. 4D. Here, the insulation layer 250 may be formed on the light-transmitting conductive layer 240 so that the insulation layer 250 has a constant thickness $t_4$. In this case, the thickness $t_4$ may be the same as or different from the thickness $t_2$ of the insulation layer 250 according to the above-described embodiments.

A section taken along line B-B' of the light emitting device is shown in FIG. 4E. Here, the insulation layer 250 may be arranged on inner sides of the through hole to extend to the inner sides of the through hole. In this case, the first conductive semiconductor layer 222 may be exposed through a bottom surface of the through hole.

Additionally, as shown in FIG. 4F, an open region is formed in a region of the insulation layer 250 corresponding to the second current blocking layer 236. Here, the above-described open region may be alternately arranged with the through hole or through electrode without facing the through hole or through electrode in a horizontal direction (see FIG. 3L)

Cross-sectional views taken along lines A-A' and B-B' of the finished light emitting device are shown in FIGS. 4G and 4H, respectively.

As shown in FIG. 4G, since the second electrode 270 is arranged on the above-described open region of the insulation layer 250, a bottom surface of the second electrode 270 comes in contact with the light-transmitting conductive layer 240, and some of sides of the second electrode 270 come in contact with the insulation layer 250. In this case, since the first electrode 260 is arranged on a surface of the insulation layer 250, the first electrode 260 may be electrically separated from the light-transmitting conductive layer 240.

As shown in FIG. 4H, since the second electrode 270 is arranged on a surface of the insulation layer 250, the second electrode 270 may be electrically separated from the light-transmitting conductive layer 240, and the first electrode 260 may come in direct electrical contact with the first conductive semiconductor layer 222 via the through hole.

FIGS. 5A and 5B are diagrams showing one embodiment of a current blocking layer of the light emitting device.

A current blocking layer 300a may be either the first current blocking layer 232 or the second current blocking layer 236. The current blocking layer 300a may be a DBR or an ODR. Here, the current blocking layer 300a may be DBR when a plurality of insulation layers are alternately arranged, the current blocking layer 300a may be an ODR when insulation layers and conductive layers are alternately arranged. In this case, the above-described conductive layer may be made of a metal.

As shown in FIG. 5A, the current blocking layer 300a may include first layers 310 and second layers 320 alternately arranged therein. Each of the first layers 310 and the second layers 320 may include an insulating material. By way of example, each of the first layers 310 and the second layers 320 may include $TiO_2$, $SiO_2$, etc.

For example, $TiO_2$ having a refractive index of 2.4 to 3.0 may be used in the first layers 310, and $SiO_2$ having a refractive index of 1.4 to 1.45 may be used in the second layers 320.

The first layers 310 and the second layers 320 may be arranged to include $SiO_2$, $Si_xO_y$, AlAs, GaAs, $Al_xIn_yP$, $Ga_xIn_yP$, and the like in addition to the above-described combinations.

As shown in FIG. 5B, the current blocking layer 300a may include first layers 310, second layers 320 and third layers 330 alternately arranged therein. Each of the first layers 310, the second layers 320, and the third layers 330 may include GaN, GaP, $SiO_2$, $RuO_2$, Ag, etc. For example, GaP may be used in the first layers 310, $SiO_2$ may be used in the second layers 320, and Ag may be used in the third layers 330. In this case, the current blocking layer 300a may serve as an ODR.

In the above-described light emitting device, the first current blocking layer and the second current blocking layer may be formed as reflective layers such as a DBR or an ODR to reflect light emitted from the active layer and traveling toward the first electrode or electrode, thereby preventing the light from being absorbed into the first or second electrode.

In addition, as shown in FIG. 2A, the insulation layer is arranged on the first current blocking layer, as viewed from a section taken along line A-A' of the light emitting device, and the insulation layer is arranged on the second current blocking layer, as viewed from a section taken along line B-B'. Such a structure may prevent an optical power from decreasing in a certain wavelength region.

FIGS. 6A and 6B show simulation and measurement results in which optical powers of light emitting devices according to embodiments are simulated and measured in certain wavelength regions.

It could be seen that the optical power is dramatically lowered in a wavelength region of approximately 450 nm in the conventional light emitting device indicated by dark line in FIGS. 6A and 6B, but the optical power is not dramatically lowered in the light emitting device indicated by blurred line.

The light emitting device according to one embodiment may have a point contact structure in which the first electrode and the second electrode come in contact with the first conductive semiconductor layer and the light-transmitting conductive layer, respectively, at the through hole and the open region. In this case, a DBR or an ODR may be used as the current blocking layer. Since the insulation layer is arranged at a region other than the through hole and the open region, a degree of absorption of light reflected on the DBR or ODR, particularly light within a blue wavelength region, may be reduced, compared to the conventional light emitting device.

FIGS. 7A and 7B are diagrams showing wavelength distributions and optical powers of light emitted from the light emitting device according to one embodiment and a conventional light emitting device, respectively.

A left semicircular region of FIG. 7A is a diagram showing a wavelength distribution of the light emitting device in which the current blocking layer is formed of silicon oxide ($SiO_2$), and a right semicircular region of FIG. 7A is a diagram showing a wavelength distribution of the light emitting device in which the current blocking layer is formed of DBR according to one embodiment.

The light emitting device in the left semicircular region of FIG. 7A has an average wavelength distribution of 450.9 nm, and the light emitting device in the right semicircular region of FIG. 7A has an average wavelength distribution of 450.4 nm. From these results, it could be seen that there is no great difference in wavelength distribution of light emitted from the light emitting device according to one embodiment, compared to the conventional light emitting device.

A left semicircular region of FIG. 7B is a diagram showing an optical power of the light emitting device in which the current blocking layer is formed of silicon oxide ($SiO_2$), and a right semicircular region of FIG. 7B is a diagram showing an optical power of the light emitting device in which the current blocking layer is formed of DBR according to one embodiment.

The light emitting device in the left semicircular region of FIG. 7B has an optical power of 122.3 mW, and the light emitting device in the right semicircular region of FIG. 7B has an optical power of 124.5 mW. From these results, it could be seen that the optical power of the light emitting device according to one embodiment is improved, compared to the conventional light emitting device.

FIG. 8 is a diagram showing one embodiment of a light emitting device package having the above-described light emitting device arranged therein.

A light emitting device package 400 according to one embodiment included a body 410 including a cavity, first and second lead frames 421 and 422 installed at the body 410, the above-described light emitting device 200 according to one embodiment installed at the body 410 and electrically coupled to the first and second lead frames 421 and 422, and a molding part 460 formed in the cavity.

The body 410 may be formed to include a silicon material, a synthetic resin material, or a metal material. Although not shown, when the body 410 is made of a conductive material such as a metal material, a surface of the body 410 is coated with the insulation layer to prevent electrical short circuits between the first and second lead frames 421 and 422. The cavity may be formed in the package body 410, and the light emitting device 200 may be arranged on a bottom surface of the cavity.

The first lead frame 421 and the second lead frame 422 are electrically separated from each other to supply a current to the light emitting device 200. In addition, the first and second lead frames 421 and 422 may reflect light generated at the light emitting device 200 to improve light efficiency, and may radiate heat generated at the light emitting device 200.

The light emitting device 200 may be configured according to the above-described embodiments, and thus may be electrically coupled to the first lead frame 421 and the second lead frame 422 by means of wires 440.

The light emitting device 200 may be fixed in a bottom surface of the package body 410 using a conductive paste (not shown), and the molding part 460 may protect the light emitting device 200 by covering the light emitting device 200. In this case, since the phosphor 470 is included in the molding part 460, the phosphor 470 may be excited by light with a first wavelength region emitted from the light emitting device 200 to emit light with a second wavelength region.

The one or plurality of light emitting devices according to the above-described embodiments may be mounted on the light emitting device package 400, but the disclosure is not limited thereto.

The above-described light emitting device and light emitting device package may be used as a light source for lighting systems. By way of example, the light emitting device and light emitting device package may be used in light emitting apparatuses such as backlight units for image display devices, lightings, etc.

When the light emitting device and light emitting device package is used in the backlight units for image display devices, the light emitting device and light emitting device package may be used as an edge-type backlight unit or a direct-type backlight unit. On the other hand, when the light emitting device and light emitting device package is used in the lightings, the light emitting device and light emitting device package may be used as a luminaire or a bulb-type light source.

As is apparent from the above description, the light emitting device according to one embodiment may have a point contact structure in which the first electrode and the second electrode come in contact with the first conductive semiconductor layer and the light-transmitting conductive layer, respectively, at the through hole and the open region. In this case, a DBR or an ODR may be used as the current blocking layer. Since the insulation layer is arranged at a region other than the through hole and the open region, a degree of absorption of light reflected on the DBR or ODR, particularly light within a blue wavelength region, may be reduced, compared to the conventional light emitting device.

Therefore, the wavelength distributions of light emitted from the light emitting device according to one embodiment does not significantly differ from that of the conventional light emitting device, and thus the optical power may be improved, compared to the conventional light emitting device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a light emitting structure comprising a first conductive semiconductor layer, an active layer, and a second conductive semiconductor layer;
a first current blocking layer disposed on the light emitting structure;
a second current blocking layer disposed on the light emitting structure and electrically separated from the first current blocking layer;
a light-transmitting conductive layer disposed on the first current blocking layer, the second current blocking layer, and the light emitting structure;
a first electrode electrically connected to the first conductive semiconductor layer and overlapped with the first current blocking layer in a vertical direction;
a second electrode electrically connected to the second conductive semiconductor layer and overlapped with the second current blocking layer in the vertical direction;
a through electrode disposed through the light-transmitting conductive layer, the second conductive semiconductor layer and the active layer to a portion of the first conductive semiconductor layer; and an insulation layer disposed between the first electrode and the first current blocking layer and between the second electrode and the second current blocking layer, wherein the through electrode is electrically connected to the first electrode and electrically separated from the light-transmitting conductive layer, the second conductive semiconductor layer and the active layer by the insulation layer.

2. The light emitting device of claim 1, wherein the through electrode non-overlaps the first current blocking layer in the vertical direction.

3. The light emitting device of claim 1, wherein the through electrode and the first current blocking layer are linearly arranged in a horizontal direction.

4. The light emitting device of claim 1, wherein the first electrode comprises a first bonding pad and a first branched-finger electrode.

5. The light emitting device of claim 4, wherein the first bonding pad is arranged at a first edge region of the light emitting device.

6. The light emitting device of claim 4, wherein at least a portion of the first branched-finger electrode overlaps the through electrode and the first current blocking layer in the vertical direction.

7. The light emitting device of claim 1, wherein the through electrode has a length smaller than a distance between neighboring through electrodes.

8. The light emitting device of claim 1, wherein the second electrode comprises a second bonding pad and a second branched-finger electrode.

9. The light emitting device of claim 8, wherein the second bonding pad is arranged at a second edge region of the light emitting device.

10. The light emitting device of claim 9, wherein a portion of the second branched-finger electrode overlaps the second current blocking layer in the vertical direction.

11. The light emitting device of claim 1, wherein a portion of the insulation layer is opened to form an open region, and the light-transmitting conductive layer is exposed through the open region.

12. The light emitting device of claim 11, wherein the light-transmitting conductive layer directly contacts to the second electrode at the open region.

13. The light emitting device of claim 11, wherein the open region and the through electrode are alternately arranged in a horizontal direction.

14. The light emitting device of claim 1, wherein at least one of the first current blocking layer and the second current blocking layer is a distributed Bragg reflector (DBR) or an omni-directional reflector (ODR).

15. A light emitting device, comprising:
a light emitting structure comprising a first conductive semiconductor layer, an active layer, and a second conductive semiconductor layer;
a first current blocking layer disposed on the light emitting structure;
a second current blocking layer disposed on the light emitting structure and electrically separated from the first current blocking layer;
a light-transmitting conductive layer disposed on the first current blocking layer, the second current blocking layer, and the light emitting structure;
a first electrode electrically connected to the first conductive semiconductor layer and overlapped with the first current blocking layer in a vertical direction;
a second electrode electrically connected to the second conductive semiconductor layer and overlapped with the second current blocking layer in the vertical direction;
a through electrode electrically connected to the first electrode and disposed through the light-transmitting conductive layer, the second conductive semiconductor layer and the active layer to a portion of the first conductive semiconductor layer; and
an insulation layer disposed between the first electrode and the first current blocking layer and between the second electrode and the second current blocking layer, wherein a portion of the insulation layer is opened to form an open region, and the light-transmitting conductive layer is exposed through the open region, and wherein the insulation layer has a constant thickness on light-transmitting conductive layer except for at the open region, and a height of the insulation layer is greater at regions corresponding to at least one of the first current blocking layer or the second current blocking layer than the other regions.

16. The light emitting device of claim 15, wherein the through electrode is electrically separated from the light-transmitting conductive layer, the second conductive semiconductor layer and the active layer by the insulation layer.

17. The light emitting device of claim 15, wherein the through electrode non-overlaps the first current blocking layer in the vertical direction.

18. The light emitting device of claim 15, wherein at least one of the first current blocking layer and the second current blocking layer is a distributed Bragg reflector (DBR) or an omni-directional reflector (ODR).

19. A light emitting device, comprising:
a light emitting structure comprising a first conductive semiconductor layer, an active layer, and a second conductive semiconductor layer;
a first current blocking layer disposed on the light emitting structure;
a second current blocking layer disposed on the light emitting structure and electrically separated from the first current blocking layer;
a light-transmitting conductive layer disposed on the first current blocking layer, the second current blocking layer, and the light emitting structure;
a first electrode electrically connected to the first conductive semiconductor layer;
a second electrode electrically connected to the second conductive semiconductor layer;
a through electrode electrically connected to the first electrode and disposed through the light-transmitting conductive layer, the second conductive semiconductor layer and the active layer to a portion of the first conductive semiconductor layer; and
an insulation layer disposed between the first electrode and the first current blocking layer and between the second electrode and the second current blocking layer, wherein at least one of the first current blocking layer and the second current blocking layer is a distributed Bragg reflector (DBR) or an omni-directional reflector (ODR).

20. The light emitting device of claim 19, wherein the first electrode overlaps the first current blocking layer in a vertical direction, and the second electrode overlaps the second current blocking layer in the vertical direction.

* * * * *